(12) United States Patent
Kim et al.

(10) Patent No.: US 7,439,141 B2
(45) Date of Patent: Oct. 21, 2008

(54) SHALLOW TRENCH ISOLATION APPROACH FOR IMPROVED STI CORNER ROUNDING

(75) Inventors: Unsoon Kim, Santa Clara, CA (US); Yu Sun, Saratoga, CA (US); Hiroyuki Kinoshita, Sunnyvale, CA (US); Kuo-Tung Chang, Saratoga, CA (US); Harpreet K. Sachar, Sunnyvale, CA (US); Mark S. Chang, Los Altos, CA (US)

(73) Assignee: Spansion, LLC, Sunnyvale, CA (US)

( * ) Notice: Subject to any disclaimer, the term of this patent is extended or adjusted under 35 U.S.C. 154(b) by 1439 days.

(21) Appl. No.: 10/277,395

(22) Filed: Oct. 22, 2002

(65) Prior Publication Data

US 2003/0176043 A1    Sep. 18, 2003

Related U.S. Application Data

(63) Continuation-in-part of application No. 10/032,631, filed on Dec. 27, 2001, now abandoned.

(51) Int. Cl.
*H01L 21/00* (2006.01)

(52) U.S. Cl. .................... 438/296; 438/435

(58) Field of Classification Search ............ 438/296, 438/435
See application file for complete search history.

(56) References Cited

U.S. PATENT DOCUMENTS

| | | | | |
|---|---|---|---|---|
| 5,719,085 A | | 2/1998 | Moon et al. | 438/424 |
| 5,741,740 A | * | 4/1998 | Jang et al. | 438/435 |
| 5,861,339 A | * | 1/1999 | Lien | 438/452 |
| 5,970,363 A | * | 10/1999 | Kepler et al. | 438/435 |
| 5,998,280 A | * | 12/1999 | Bergemont et al. | 438/425 |
| 6,040,232 A | | 3/2000 | Gau | 438/424 |
| 6,054,343 A | * | 4/2000 | Ashburn | 438/221 |
| 6,087,243 A | | 7/2000 | Wang | 438/424 |
| 6,165,854 A | * | 12/2000 | Wu | 438/296 |
| 6,326,283 B1 | | 12/2001 | Liang et al. | 438/424 |
| 6,541,382 B1 | * | 4/2003 | Cheng et al. | 438/692 |
| 6,670,689 B2 | * | 12/2003 | Oh et al. | 257/506 |
| 6,689,665 B1 | * | 2/2004 | Jang et al. | 438/296 |
| 2001/0012676 A1 | | 8/2001 | Dickerson et al. | 438/435 |
| 2001/0041421 A1 | | 11/2001 | Park et al. | 438/424 |
| 2002/0117731 A1 | * | 8/2002 | Kim et al. | 257/510 |
| 2003/0176043 A1 | * | 9/2003 | Kim et al. | 438/424 |

FOREIGN PATENT DOCUMENTS

EP        1160852 A2        5/2001

OTHER PUBLICATIONS

Naoki Ueda et al. "A New Two-Step Round Oxidation STI Technology for Highly Reliable Flash Memory,"Extended Abstracts of the International Conference on Solid State Devices and Materials, Japan Society of Applied Physics. Tokyo, Japan, vol. 2001, Sep. 26, 2001, pp. 538-539.

* cited by examiner

*Primary Examiner*—Laura M Menz
(74) *Attorney, Agent, or Firm*—Winstead, P.C.

(57) ABSTRACT

A method for performing shallow trench isolation during semiconductor fabrication that improves trench corner rounding is disclosed. The method includes etching trenches into a silicon substrate between active regions, and performing a double liner oxidation process on the trenches. The method further includes performing a double sacrificial oxidation process on the active regions, wherein corners of the trenches are substantially rounded by the four oxidation processes.

8 Claims, 5 Drawing Sheets

US 7,439,141 B2

SHALLOW TRENCH ISOLATION APPROACH FOR IMPROVED STI CORNER ROUNDING

CROSS-REFERENCE TO RELATED APPLICATION

This application is a Continuation-In-Part claiming priority of U.S. patent application entitled "Shallow Trench Isolation Approach for Improved STI Corner Rounding", Ser. No. 10/032,631, filed Dec. 27, 2001 now abandoned.

FIELD OF THE INVENTION

The present invention relates to semiconductor processing, and more particularly to a method for performing trench isolation during semiconductor device fabrication.

BACKGROUND OF THE INVENTION

Shallow trench isolation (STI) technology uses shallow, refilled trenches for isolating devices of the same type as replacements for LOCOS isolation. The process begins by depositing a layer of pad oxide on a silicon substrate and patterning a nitride mask to define active regions on the silicon substrate. Shallow trenches are then etched into the silicon substrate in the openings in the nitride mask between the active regions. A liner oxidation process is performed in the recesses in which a thin layer of oxide is grown. Next, an oxide (e.g., SiO2) is deposited over the silicon substrate and is then etched back so that it remains only in the trenches, its top surface level with the nitride mask. After the oxide is etched back, the nitride mask is stripped to expose the pad oxide and a dip back process is performed on the pad oxide. Thereafter, a layer of polysilicon (Poly1) may be patterned to define floating gate structures for the semiconductor device.

Although the STI process has the advantages of eliminating birds beak of the LOCOS process and of providing a planar surface, the STI process has several drawbacks. FIG. 1 is a block diagram illustrating a cross-sectional view of a portion of a semiconductor fabricated during a conventional STI process. Trenches 10 have been etched in isolation regions 18 of the substrate 12 adjacent to active regions 20 on which a layer of polysilicon 14 has been deposited. The silicon substrate 12 in the active regions 20 form the side walls 22 of the trenches 10. Conventional STI processing results in the trenches 10 having sharp corners 16, as shown. Because both the silicon substrate 12 and the polysilicon 14 are conductive, the sharp corners 16 increase the chance of electron leakage (E) between the polysilicon 14 and the silicon substrate 12 due to the presence of an electric field, which is increased with by the sharpness of the substrate corners 16.

Conventional approaches for rounding the trench corners 16 include 1) performing a single liner oxidation with a double sacrificial oxidation or 2) performing a double liner oxidation with a single sacrificial oxidation. Both the approaches, however, fail to sufficiently round the trench corners 16 to reduce electron leakage to an acceptable level.

Accordingly what is needed is a STI process that has improved trench corner rounding that significantly prevents electron leakage between the polysilicon and the active regions of the substrate. The present invention addresses such a need.

SUMMARY OF THE INVENTION

The present invention provides a method for performing shallow trench isolation during semiconductor fabrication that improves trench corner rounding. The method includes etching trenches into a silicon substrate between active regions, and performing a double liner oxidation process on the trenches. The method further includes performing a double sacrificial oxidation process on the active regions, wherein corners of the trenches are substantially rounded by the four oxidation processes.

According to the present invention, the trench corners are substantially rounded, which significantly reduces electron leakage between the polysilicon and the active regions of the substrate and increases performance of the semiconductor devices.

DETAILED DESCRIPTION

The present invention relates to a method for performing trench isolation during semiconductor device fabrication. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a method for performing shallow trench isolation that improves STI corner rounding in a semiconductor device. After etching shallow trenches into a substrate, the process includes performing a double liner oxidation process on the trenches prior to STI fill. Thereafter, a double sacrificial oxidation process is performed, resulting in improved STI corner rounding.

Figure 1:
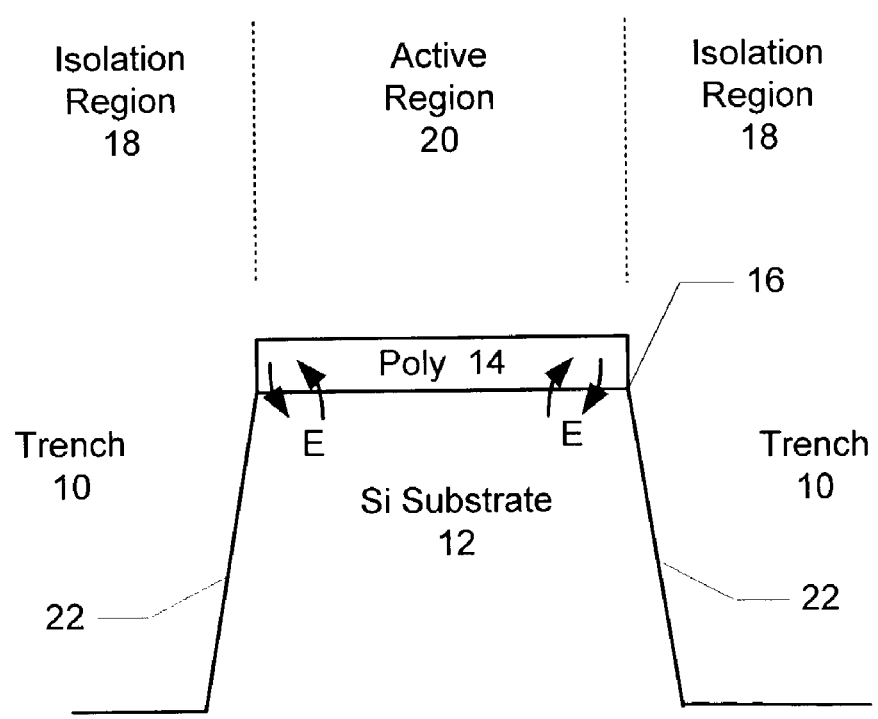
FIG. 1 is a block diagram illustrating a cross-sectional view of a portion of a semiconductor fabricated during a conventional STI process.
Figure 2:
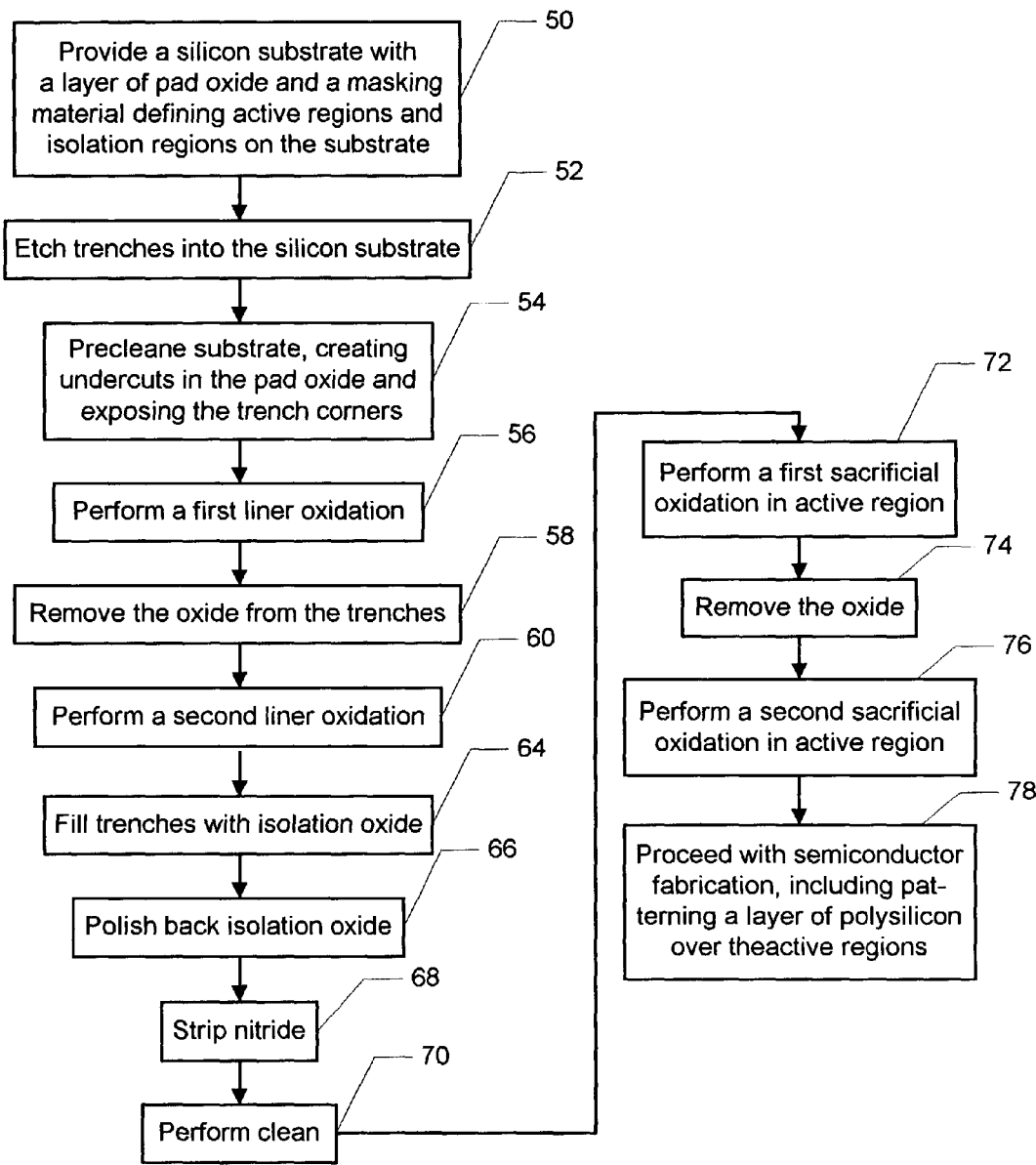
FIG. 2 is a flow chart illustrating the STI spacer process in accordance with one preferred embodiment of the present invention.

FIG. 2 is a flow chart illustrating the STI spacer process in accordance with one preferred embodiment of the present invention. FIGS. 3A-3G are cross-sectional views of the substrate corresponding to the steps illustrated in FIG. 2.

Figure 3A:
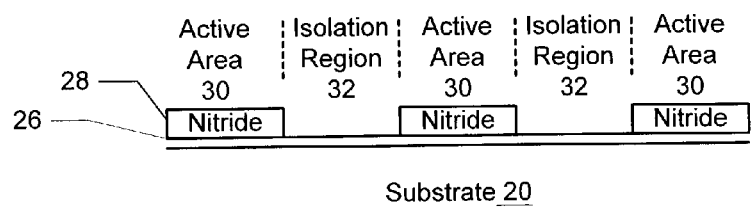
FIGS. 3A-3N are cross-sectional views of the substrate corresponding to the steps illustrated in FIG. 2.
Figure 3B:
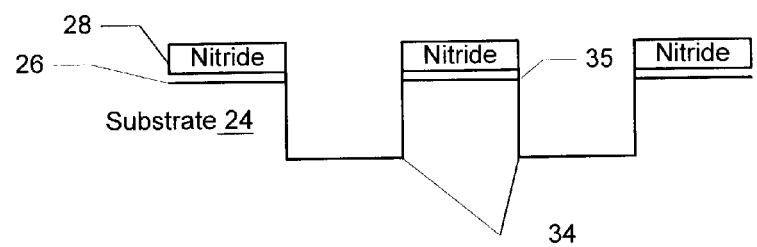

The process begins by providing a silicon substrate 24 with a layer of pad oxide 26 ($S_1O_2$) and a masking material, such as a layer of silicon nitride 28, defining active regions 30 and isolation regions 32 on the substrate 24 in step 50 (FIG. 3A). Trenches 34 are then etched into the silicon substrate 24 using the nitride 28 as a mask in step 52 (FIG. 3B). As shown, the active regions 30 of the substrate 20 form the walls and corners 35 of the trenches 34.

Figure 3C:
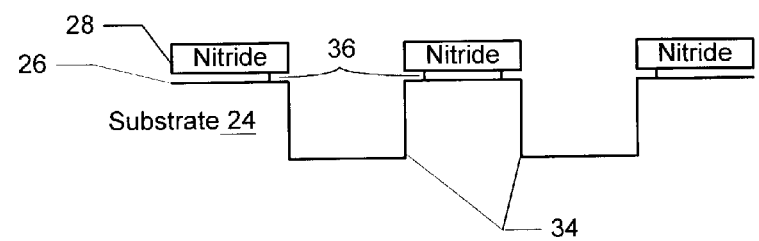

After the trenches 34 have been formed, the substrate 24 is precleaned in step 54, creating undercuts 36 in the pad oxide 26, as shown in FIG. 3C. Undercutting the pad oxide 26 is necessary to expose the trench corners 35 for subsequent rounding steps. In a preferred embodiment, a HF solution is used for the precleaning, where the amount of the undercut 36 is a function of the HF time used. In a preferred embodiment, approximately 100-300 Å of the pad oxide 26 is removed in the undercut 36.

Figure 3D:
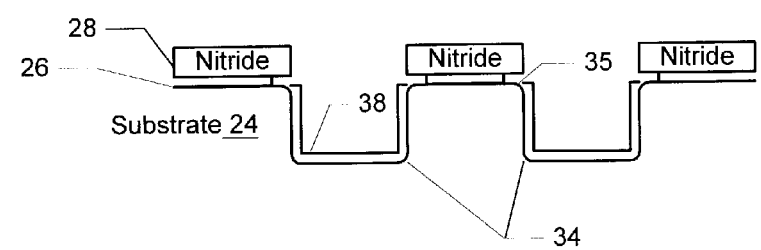

After the preclean, a first liner oxidation is performed in which a thin layer of oxide 38 is grown in the trenches 34 in step 56 (FIG. 3D). In a preferred embodiment, an oxidation temperature of 900-1100 degrees Celsius is used to grow the oxide 38 to a thickness of approximately 100-300 Å. As it is well-known in the art, one-half of the material used to grow the oxide comes from the silicon substrate 24. Accordingly, 50-150 Å of the substrate 24 in the trenches 34 is consumed during this process, which rounds the trench corners 35.

Figure 3E:
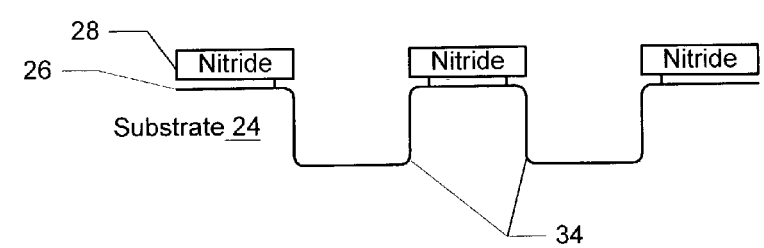
Figure 3F:
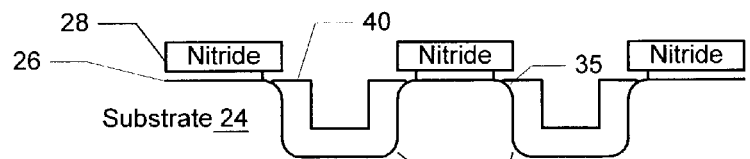
Figure 3G:
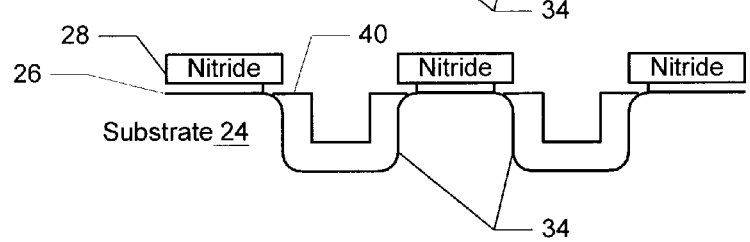

After the first liner oxidation, a dip back is performed to remove the oxide 38 from the surface of the trenches 34 in step 58 (FIG. 3E). After the oxide 38 is removed, a second liner oxidation is performed in which a second layer of oxide 40 is again grown in the trenches 34 in step 60 (FIG. 3F). In a preferred embodiment, the second liner oxidation grows approximately 100-500 Å of oxide 40, which is thicker than that grown in the first liner oxidation. Accordingly another 50-250 Å of trench substrate 24 is consumed during this process, which rounds the trench corners 35 a second time.

Figure 3H:
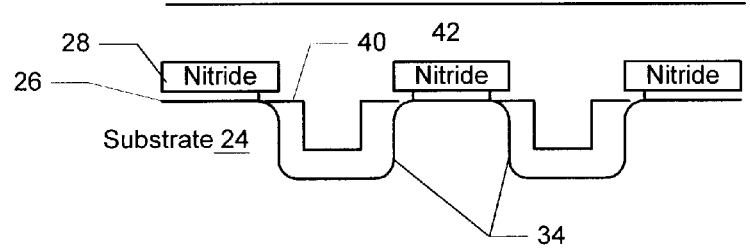
Figure 3I:
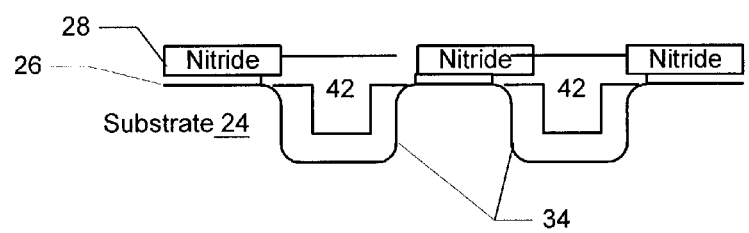
Figure 3J:
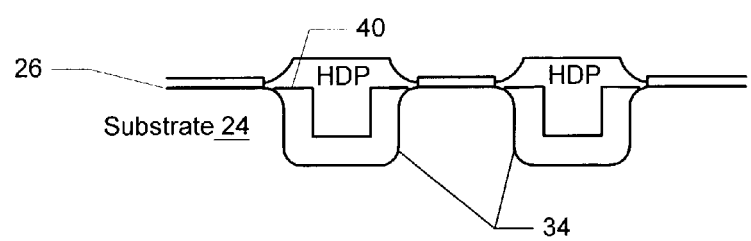

After the second lincer oxidation, the trenches 34 are filled by depositing an isolation oxide 42 over the substrate 24 in step 64, such as TEOS (tetraethyl orthosilicate) or HDP (high-density plasma) (FIG. 3H). After the isolation oxide 42 is deposited, the isolation oxide 42 is polished back in step 66 so that its top surface in the trenches 34 is approximately level with the nitride mask 28 (FIG. 3I). The nitride 28 is then stripped to expose the pad oxide 26 in step 68 (FIG. 3J). After the nitride 28 is stripped, a standard RCA clean is performed on the active regions 30 of the silicon substrate 24 in step 70, which oxidizes a small portion of the pad oxide 26 (e.g., 4-5 Å).

Figure 3K:
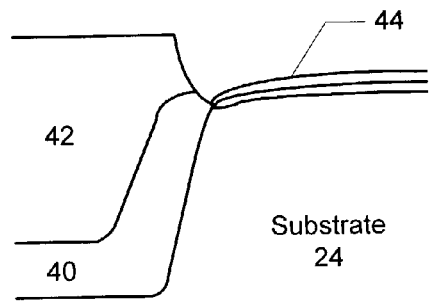

FIGS. 3K-3N are zoomed-in cross-sectional views of portions showing a filled trench 34 and the silicon substrate 24 under an active region 30. Referring to both FIGS. 2 and 3K-3N, after the clean, a first sacrificial oxidation is performed in which a thin layer of oxide liner 44 is grown on the active regions 30 of the silicon substrate 24 in step 72 (FIG. 3K). In a preferred embodiment, an oxidation temperature of 900-1000 degrees Celsius is used to grow the oxide 44 to a thickness of approximately 50-150 Å. Because one-half of the material used to grow the oxide 44 comes from the silicon substrate 24, approximately 25-75 Å of the substrate 24 is consumed during this process, rounding the trench corners 35 for a third time.

Figure 3L:
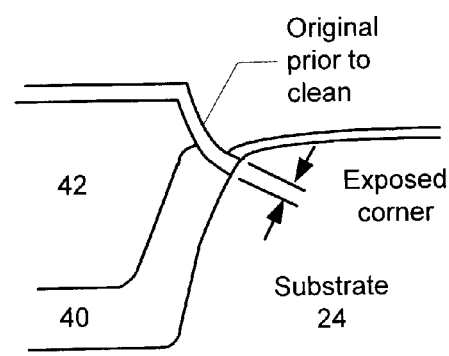

After the first sacrificial oxidation, a dip back is performed to remove the oxide 44 in step 74. In a preferred embodiment, the dip back removes approximately 200 Å of material, which is slightly larger than the thickness of the oxide 44 grown during the first oxidation. Thus, the dip back removes not only the oxide 44, but also a portion of the fill material 42, which exposes the corner of the trench for a second sacrificial oxidation, as shown in FIG. 3L.

Figure 3M:
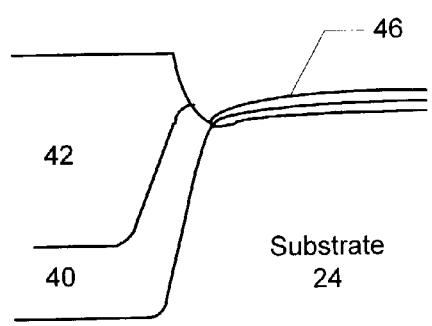

After the oxide 44 is removed, a second sacrificial oxidation is performed in which a second layer of oxide 46 is again grown on the active regions 30 of the silicon substrate 24 in step 76 (FIG. 3M). In a preferred embodiment, the second sacrificial oxidation is performed under the same conditions as the first sacrificial oxidation. Accordingly another 50-75 Å of the substrate 24 is consumed during this process, which rounds the trench corners 35 for a fourth time.

Figure 3N:
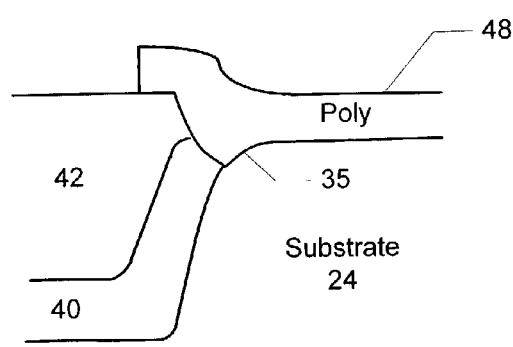

Semiconductor fabrication then proceeds as normal in step 78, including removing the oxide 46, performing implants, and patterning at least one a layer of polysilicon 48 over the active regions 30 (FIG. 3N). Because the trench corners 35 are significantly rounded due to the four separate corner-rounding processes, the present invention substantially reduces electron leakage between the polysilicon 48 and the active regions 30 of the substrate 24, thereby increasing performance of the semiconductor device.

A method for performing STI has been disclosed in which two liner oxidations are performed in the trenches, followed by two sacrificial oxidations. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for performing shallow trench isolation during semiconductor fabrication that improves trench corner rounding, the method comprising the steps of:
   (a) etching trenches into a silicon substrate between active regions;
   (b) performing a double liner oxidation process on the trenches; and
   (c) performing a double sacrificial oxidation process on the active regions, wherein corners of the trenches are rounded in each of the four oxidation processes.

2. A method for performing shallow trench isolation during semiconductor fabrication that improves trench corner rounding, the method comprising the steps of:
   (a) etching trenches into a silicon substrate between active regions;
   (b) performing a double liner oxidation process on the trenches; and
   (c) performing a double sacrificial oxidation process on the active regions, wherein corners of the trenches are rounded in each of the four oxidation processes, wherein the silicon substrate includes a layer of pad oxide and a masking material that defines actives regions and isolation regions on the substrate, step (a) further including the step of:
      (i) precleaning the silicon substrate prior to the double liner oxidation, thereby creating undercuts in the pad oxide to expose the trench corners for the subsequent oxidation processes.

3. The method of claim 2 wherein step (a) further includes the step of:
   (i) removing approximately 100-300 angstroms of the pad oxide.

4. The method of claim 2 wherein step (b) further includes the steps of:
   (i) performing a first liner oxidation process on the trenches in which a first layer of oxide is grown in the trenches;
   (ii) removing the first layer of oxide from the trenches; and
   (iii) performing a second liner oxidation process on the trenches after removal of the first layer of oxide from the trenches in which a second layer of oxide is grown in the trenches.

5. The method of claim 4 wherein prior to step (c), the method further includes the steps of:
   depositing an isolation oxide over the substrate;
   polishing the isolation oxide back so that the isolation oxide is approximately level with the masking material; and
   removing the masking material.

6. The method of claim 5 further including the step of: performing a standard clean on the active regions of the substrate after removing the masking material.

7. The method of claim 4 wherein step (c) further includes the steps of:

(i) performing a first sacrificial oxidation process on the substrate in which a first layer of oxide is grown on the substrate;
(ii) removing the first layer of oxide from the trenches; and
(iii) performing a second sacrificial oxidation process on the substrate in which a second layer of oxide is grown on the substrate.

8. The method of claim 7 further including the steps of:
(d) continuing with the fabrication process, including patterning a layer of polysilicon over the substrate in the active regions, wherein due to the rounded trench corners, electron leakage between the polysilicon and the silicon substrate is substantially reduced.

\* \* \* \* \*